US006855483B2

(12) United States Patent
Hattori et al.

(10) Patent No.: US 6,855,483 B2
(45) Date of Patent: *Feb. 15, 2005

(54) METHOD FOR PATTERN FORMATION AND PROCESS FOR PREPARING SEMICONDUCTOR DEVICE

(75) Inventors: Takashi Hattori, Musashimurayama (JP); Yuko Tsuchiya, Tokorozawa (JP); Hiroshi Shiraishi, Hachiouji (JP)

(73) Assignee: Hitachi, Ltd., Tokyo (JP)

( * ) Notice: Subject to any disclaimer, the term of this patent is extended or adjusted under 35 U.S.C. 154(b) by 47 days.

This patent is subject to a terminal disclaimer.

(21) Appl. No.: 10/263,704

(22) Filed: Oct. 4, 2002

(65) Prior Publication Data

US 2003/0099905 A1 May 29, 2003

Related U.S. Application Data

(63) Continuation of application No. 09/649,592, filed on Aug. 29, 2000, now Pat. No. 6,489,082, which is a continuation of application No. 09/432,797, filed on Nov. 3, 1999, now Pat. No. 6,156,486, which is a continuation of application No. 09/086,610, filed on May 29, 1998, now Pat. No. 6,017,680.

(30) Foreign Application Priority Data

Aug. 5, 1997  (JP) .............................................. 9-210360

(51) Int. Cl.$^7$ ................................................. G03F 7/00
(52) U.S. Cl. ...................... 430/313; 430/311; 430/318; 430/322; 430/325; 430/945
(58) Field of Search .................................. 430/311, 313, 430/318, 322, 325, 945

(56) References Cited

U.S. PATENT DOCUMENTS 4,942,113 A   7/1990  Trundle ....................... 430/326
5,071,730 A  12/1991  Allen et al. ................ 430/270.1
5,910,392 A   6/1999  Nozaki et al. ............. 430/270.1
6,017,680 A   1/2000  Hattori et al. ............... 430/313
6,027,856 A   2/2000  Nozaki et al. ............. 430/281.1
6,156,486 A  12/2000  Hattori et al. ............... 430/313

FOREIGN PATENT DOCUMENTS

| JP | 62-164045 | 7/1987 |
| JP | 3-179355 | 8/1991 |
| JP | 4-396359 | 2/1992 |
| JP | 4-165359 | 6/1992 |
| JP | 4-184345 | 7/1992 |
| JP | 4-226461 | 8/1992 |
| JP | 5-80515 | 4/1993 |
| JP | 5-257284 | 10/1993 |
| JP | 5-265212 | 10/1993 |
| JP | 7-28237 | 1/1995 |
| JP | 8-259626 | 10/1996 |

OTHER PUBLICATIONS

Y. Tsuchiya et al, "Investigation of Acid–Catalyzed Insolubilization Reactions for Alicyclic Polymers with Carboxyl Groups", Journal of Photopolymer Science and Technology, vol. 10, No. 4, 1997, pp. 579–584.

F.M. Houlihan et al, "Synthesis of Cycloolefin–Maleic Anhydride Alternating Coppolymers for 193 nm Imaging", Macromolecules, 1997, 30, pp. 6517–6524.

Primary Examiner—Mark F. Huff
Assistant Examiner—Nicole Barreca
(74) Attorney, Agent, or Firm—Mattingly, Stanger & Malur, P.C.

(57) ABSTRACT

A negative pattern is formed to be transparent in the far ultraviolet region including the wavelength 193 nm of an ArF excimer laser and, despite its chemical structure having high dry etching, does not swell and has excellent resolution. An acid-catalyzed reaction is utilized wherein a γ-hydroxy or δ-hydroxy carboxylic acid structure is partially or entirely converted to a γ-lactone or δ-lactone structure. The negative pattern is developed with an aqueous alkali solution without swelling.

5 Claims, 2 Drawing Sheets

METHOD FOR PATTERN FORMATION AND PROCESS FOR PREPARING SEMICONDUCTOR DEVICE

This is a continuation application U.S. Ser. No. 09/649,592, filed Aug. 29, 2000 now U.S. Pat. No. 6,489,082; which is a continuation application of U.S. Ser. No. 09/432,797, filed Nov. 3, 1999, now U.S. Pat. No. 6,156,486; which is a continuation application of U.S. Ser. No. 09/086,610, filed May 29, 1998, now U.S. Pat. No. 6,017,680.

FIELD OF THE INVENTION

The present invention relates to a microlithographic process using a photosensitive composition, a micromachining technique for preparing a semiconductor device, or the like, and a process for preparing the semiconductor device, or the like, including the microlithographic process. More particularly, the present invention relates to a method for forming a negative pattern suitable for a photolithographic process using a far ultraviolet radiation having a wavelength of not more than 220 nm, such as an ArF excimer laser, which is a radiation source for wavelengths shorter than those in currently used UV sources including high pressure mercury lamps and KrF excimer lasers.

BACKGROUND OF THE INVENTION

A photolithographic technique for fabricating micro-order or submicron-order fine patterns within an electronic device, such as a semiconductor, has been at the core of micromachining techniques for mass production. A demand for an increase in integration and an increase in density of semiconductor devices in recent years has led to many improvements in micromachining techniques. In particular, as the minimum possible machining dimension approaches the exposure wavelength, photolithographic techniques using light sources for shorter wavelengths ranging from g-line (436 nm) and i-line (365 nm) in a high pressure mercury lamp to a KrF excimer laser (248 nm), have been developed. A change in exposure wavelength has led to the development of photoresists made from materials suitable for the wavelength being used. In any of the photoresists suitable for the above wavelengths, aqueous alkali development utilizing the solubility of resins having a phenol structure or polymeric materials in an aqueous alkali has been adopted on a commercial scale, although they are different from each other in photoactive compound and photoactivating mechanism. These resins and polymeric materials necessarily contain many aromatic rings which are also chemical structural elements for enhancing the etching resistance in the step of dry etching after the formation of the resist pattern.

Negative resists prepared from resins having the above-mentioned phenol structure are classified into ones of a crosslinking type as disclosed in Japanese Patent Laid-Open No. 164045/1987 and ones of a dissolution inhibition type as disclosed in Japanese Patent Laid-Open No. 165359/1992. In any type, submicron-order fine patterns can be formed without causing swelling.

Photolithography using an ArF excimer laser (193 nm) as a light source has become more and more commonplace for photolithography which can provide a minimum possible machining dimension of less than 0.25 $\mu$m. This wavelength corresponds to the absorption maximum of an aromatic ring. Therefore, in the photoresist material composed mainly of a phenol structure, which has been used on a commercial scale, the formation of a latent image in response to the exposure is limited to a portion which is very near the surface of the photoresist film, making it difficult to form a fine resist pattern by aqueous alkali development.

On the other hand, various resist materials have been proposed which have high transmittances in the above-mentioned wavelength region while possessing high dry-etching resistance. Utilization of an adamantane structure (Japanese Patent Laid-Open Nos. 39665/1992 and 265212/1993) and utilization of a norbornane structure (Japanese Patent Laid-Open Nos. 80515/1993 and 257284/1993) have been proposed as chemical structures which are transparent in the far ultraviolet region including the wavelength 193 nm of the ArF excimer laser and, instead of the aromatic ring, can impart dry-etching resistance to the resist material. Japanese Patent Laid-Open Nos. 28237/1995 and 259626/1996 disclose that, in addition to these structures, general alicyclic structures, such as a tricyclodecanyl group, are also useful.

Regarding resist materials which have been rendered developable with an aqueous alkali by using a polymer having a chemical structure transparent in the far ultraviolet region including the wavelength 193 nm of the ArF excimer laser and, utilization of the carboxylic acid structure of acrylic acid or methacrylic acid, has been attempted in Japanese Patent Laid-Open Nos. 39665/1992, 184345/1992, 226461/1992, and 80515/1993. In these publications, the aqueous alkali solubility of a portion dissolved in a developing solution in the aqueous alkali development depends upon the carboxylic acid structure of acrylic acid or methacrylic acid. Furthermore, Japanese Patent Laid-Open No. 8-259626 discloses a polymeric compound in which a carboxylic acid group has been provided in an alicyclic structure introduced into the side chain of a methacrylic acid ester.

SUMMARY OF THE INVENTION

The phenol structure which has so far been used as an alkali-soluble group has a pKa of 10.0 (phenol), whereas the above carboxylic acid structure has a pKa of as low as 4.8 (acetic acid), indicating that its acidity is high. Therefore, when they are used as the alkali-soluble group of the base resin, the results is that with the same molar fraction the resin having a carboxylic acid structure has a higher dissolution rate in an aqueous alkali and in addition can be dissolved in an alkali developing solution having such a low concentration that it will not dissolve the resin having a phenol structure.

Use of the resin having a carboxylic acid structure in combination with a cross-linking agent as described in Japanese Patent Laid-Open No. 164045/1987 is disadvantageous because it causes the carboxylic acid having high acidity to remain in the crosslinked portion and an alkali developing solution infiltrates into this portion and swells, which makes it impossible to form a fine pattern. On the other hand, when use is made of a material described in Japanese Patent-Laid Open No. 165359/1992, wherein the acid formed upon exposure produces a compound having a dissolution inhibitory activity, no contrast in dissolution is created if the resin has a carboxylic acid structure, thereby making it impossible to provide a negative resist disadvantageously.

The fact that an acid-catalyzed reaction of a carboxylic acid with an alcohol in a solution results in conversion of the carboxylic acid to a carboxylic acid ester is generally known in the art, and this reaction is one useful method for synthesizing a carboxylic acid ester. Since, however, this reaction is an equilibrium reaction, it is necessary for the reaction to proceed toward the ester side. Thus, alcohol should be used in large excess and, in addition, water as a by-product should be discharged outside the system. When the application of this reaction to a radiation-sensitive composition is contemplated, the alcohol cannot be added in large excess while maintaining the solubility of the coating in an alkali. Further, in this case, it is difficult to discharge water produced in the reaction outside the system. For this reason, in general, the esterification proceeds to an extent of only several percent. A reduction in the amount of the carboxylic acid to this extent is unsatisfactory for creating contrast of dissolution high enough to form a pattern.

A first object of the present invention is to provide a method for negative pattern formation which enables development using an aqueous alkali developing solution without causing swelling of a fine pattern, utilizes esterification of a resin having a carboxylic acid structure, and provides a fine pattern with excellent resolution.

A second object of the present invention is to provide a process for preparing a semiconductor device using the method for pattern formation according to the first object of the present invention.

The first object of the present invention can be attained by a method for pattern formation, including the following steps: forming a coating having a photosensitive composition containing at least a carboxylic acid structure on a predetermined substrate; irradiating the coating with an actinic radiation in a predetermined pattern form to form a desired latent image pattern in the coating; heating the exposed coating to allow the reaction to proceed; and then developing the heated coating with an aqueous alkali developing solution to form a desired pattern in the coating, wherein the carboxylic acid structure in the areas irradiated with the actinic radiation is partially or entirely converted to a γ-lactone structure or a δ-lactone structure which is a carboxylic acid ester structure. γ-lactone structures and δ-lactone structures are easier to form and five and six member links yield better results.

Since the γ-lactone or δ-lactone structure, is formed when the alcohol group to be esterified with the carboxylic acid group is one located at the γ-position or the δ-position of the carboxylic acid group in the molecule, the esterification by the acid-catalyzed reaction occurs more easily than that in the conventional method. Also, the ester thus prepared is not hydrolyzed by an aqueous tetraalkylammonium hydroxide solution commonly used in the art and remains stable during development.

The structure for creating the γ-lactone or δ-lactone structure is preferably a γ-hydroxy carboxylic acid structure or a δ-hydroxy carboxylic acid structure. In this structure, intramolecular esterification by the acid-catalyzed reaction results in the formation of a five or six-membered ring. Thus, the esterification can easily occur.

The carboxylic acid structure used in the method for pattern formation according to the present invention is preferably a chemical structure represented by the following chemical formulas (1) or (2);

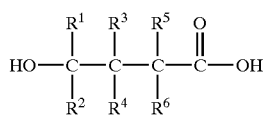

Chemical formula (1)

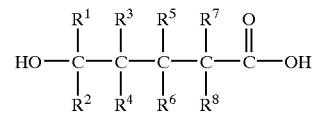

Chemical formula (2)

In these formulas, $R^1$, $R^2$, $R^3$, $R^4$, $R^5$, $R^6$, $R^7$, and $R^8$ each represent a hydrogen atom or an alkyl group having 1 to 10 carbon atoms, provided that a plurality of alkyl groups as the substituent may be linked with each other to from a cyclic alkyl group.

Furthermore, preferably, at least the carboxylic acid structure represented by chemical formulas (1) or (2) is contained in the polymeric compound constituting the photosensitive composition.

Specifically, resins each containing at least a repeating structure selected from among the following general chemical formulas (5) to (12) are preferred because they have the above structures and, further, have small absorption in the far ultraviolet region and dry-etching resistance.

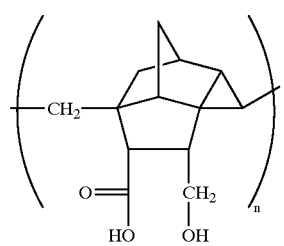

Chemical formula (5)

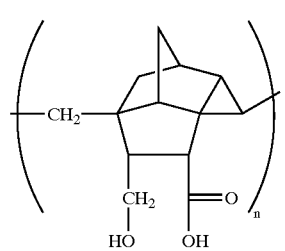

Chemical formula (6)

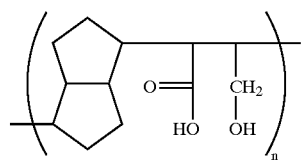

Chemical formula (7)

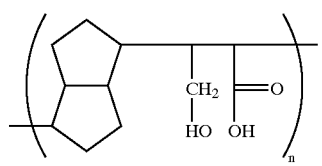

Chemical formula (8)

Chemical formula (9)

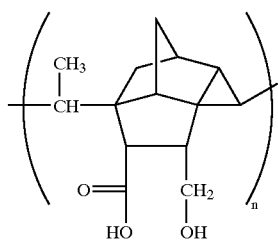

Chemical formula (10)

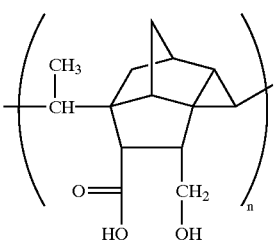

Chemical formula (11)

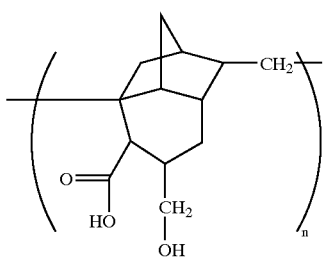

Chemical formula (12)

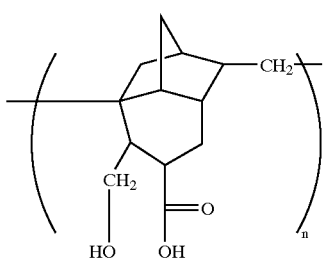

In the above formulas (5)–(12), n is an integer.

The resin having at least the repeating structure represented by the formulas (5) or (6) may be prepared by the free-radical copolymerization of a compound containing an alicyclic hydrocarbon structure, such as 5-methylenebicyclo[2.2.1]hept-2-ene, with maleic anhydride, reducing the maleic anhydride moiety to form a lactone, and conducting hydrolysis to modify the lactone.

The resin having at least a repeating structure represented by formulas (7) or (8) may be prepared by the free-radical copolymerization of a compound containing an alicyclic hydrocarbon structure, such as cycloocta-1,5-diene, with maleic anhydride, reducing the maleic anhydride moiety to form a lactone, and conducting hydrolysis for modification.

The resin having at least a repeating structure represented by formulas (9) or (10) may be prepared by the free-radical copolymerization of a compound containing an alicyclic hydrocarbon structure, such as 5-ethylenebicyclo[2.2.1]hept-2-ene, with maleic anhydride, reducing the maleic anhydride moiety to form a lactone, and conducting hydrolysis for modification.

The resin-having at least a repeating structure represented by formulas (11) or (12) may be prepared by the free-radical copolymerization of a compound containing an alicyclic hydrocarbon structure, such as 5-vinylbicyclo[2.2.1]hept-2-ene, with maleic anhydride, reducing the maleic anhydride moiety to form a lactone, and conducting hydrolysis to modify the lactone.

The weight average molecular weight of these resins is preferably 1,000 to 300,000. Among the above polymeric compounds, those having repeating units of an alicyclic structure having on its side chain the carboxylic acid structure represented by chemical formulas (1) or (2) are more advantageous over those containing directly in the backbone thereof the carboxylic acid structure represented by chemical formulas (1) or (2) because the lactonization in the acid-catalyzed reaction occurs more easily and higher sensitivity is achieved.

Specifically, a resin having repeating units of an alicyclic structure having on its side chain the carboxylic acid structure represented by chemical formulas (1) or (2), such as an alicyclic structure represented by the chemical formulas (5), (6), (9), (10), (11), or (12) is more advantageous than a resin containing directly in its backbone the carboxylic acid structure represented by the formula (7) or (8) because the pattern formation can be carried out with higher sensitivity.

When the carboxylic acid structure represented by chemical formulas (1) or (2) is contained directly in the backbone, the carboxylic acid moiety and the hydroxyl group moiety in chemical formulas (1) or (2), in some cases, become sterically distant from each other, making it difficult to lactonize the carboxylic acid structure. On the other hand, when the carboxylic acid structure represented by chemical formulas (1) or (2) is contained in the side chain, the carboxylic acid moiety and the hydroxyl group moiety are less likely to become sterically distant from each other. As a result, in such a case, the carboxylic acid structure can be easily lactonized, thereby possibly contributing to pattern formation of higher sensitivity.

A resin having the above-mentioned structures is used in combination with 0.1 to 30 parts by weight, based on the resin, of a compound capable of producing an acid upon irradiation with an actinic radiation to prepare a pattern forming material. The compounds capable of producing an acid upon irradiation with an actinic radiation include onium salts, such as triphenylsulfonium triflate, sulfonyloxyimides, such as trifluoromethanesulfonyloxynaphthylimide, and sulfonic acid esters. However, some other compound may be used if they can produce an acid upon irradiation with an actinic radiation, such as by an ArF excimer laser, for example.

The carboxylic acid structure used in the method for pattern formation according to the present invention may be also a chemical structure represented by the following chemical formulas (3) or (4):

Chemical formula (3)

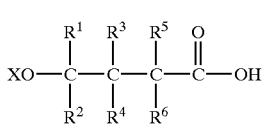

Chemical formula (4)

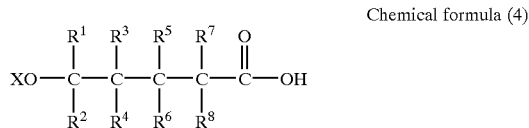

In these formulas, $R^1$, $R^2$, $R^3$, $R^4$, $R^5$, $R^6$, $R^7$ and $R^8$ each represent a hydrogen atom or an alkyl group having 1 to 10 carbon atoms, provided that a plurality of alkyl groups as the substituent may be linked with each other to from a cyclic alkyl group; and X represents an acetal or ketal, such as a 1-ethoxyethyl or tetrahydropyranyl group. In this case, since the hydroxyl group is protected by X, the thermal stability is improved.

Further, preferably, at least the carboxylic acid structure represented by chemical formulas (3) or (4) is contained in the polymeric compound constituting the photosensitive composition.

Among the above-mentioned polymeric compounds, those having repeating units of an alicyclic structure having on its side chain the carboxylic acid structure represented by the chemical formulas (3) or (4) are more advantageous than those containing directly in the backbone the carboxylic acid structure represented by chemical formulas (3) or (4) because the lactonization in the acid-catalyzed reaction can occur more easily, which possibly contributes to higher sensitivity.

When the carboxylic acid structure represented by chemical formulas (3) or (4) is contained directly in the backbone, the carboxylic acid moiety and the protected hydroxyl group in chemical formulas (3) or (4), in some cases, become sterically distant from each other, thereby making it difficult to lactonize the carboxylic acid structure. On the other hand, when the carboxylic acid structure represented by chemical formulas (3) or (4) is contained in the side chain, the carboxylic acid moiety and the protected hydroxyl group moiety are less likely to become sterically distant from each other. As a result, in such a case, the carboxylic acid structure can be easily lactonized, thereby possibly contributing to pattern formation of higher sensitivity.

The photosensitive composition containing a carboxylic acid structure used in the method for pattern formation according to the present invention may further contain an alicyclic structure for enhancing the dry-etching resistance. The alicyclic structures include adamantyl, norbornane, tricyclodecane, and androstane structures. These structures are transparent in the far ultraviolet region and possesses dry-etching resistance.

The types of actinic radiation used in the present invention include a far ultraviolet light having a wavelength of not more than 250 nm and a vacuum ultraviolet light, such as ArF excimer laser. Additionally, electron beam, EUV, and X-radiation may also be used. The aqueous alkali developing solution used in the present invention is preferably an aqueous solution of a tetraalkylammonium hydroxide having 1 to 5 carbon atoms.

The second object of the present invention can be attained according to a process for preparing a semiconductor device, including the following steps: forming a resist pattern on a semiconductor substrate by any one of the methods for pattern formation described above; and, based on the resist pattern, either etching the semiconductor substrate or implanting ions into the semiconductor substrate. The etching methods usable in the process for preparing a semiconductor device include dry etching methods, such as plasma etching, reactive ion etching, and reactive ion beam etching, and wet etching.

Substrates treatable in the process for preparing a semiconductor device according to the present invention include silicon dioxide films formed by CVD or thermal oxidation, oxide films such as coatable glass films, and nitride films, such as silicon nitride film. Additional examples of substrates usable in the process of the present invention include films of various metals, such as aluminum and alloys thereof and tungsten, and polycrystalline silicon.

According to the present invention, utilization of a highly reactive lactonization method among methods of esterification of carboxylic acids enables the carboxylic acid to be efficiently converted to a carboxylic acid ester through a reaction catalyzed by an acid produced upon exposure. Since this reaction is an intramolecular esterification, intermolecular cross-linking and the like do not occur, thereby permitting the content of the carboxylic acid in the exposed areas to be simply rendered different from that in the unexposed areas. When the carboxylic acid and the alcohol are separate molecules, only several % of the carboxylic acid in the coating can be esterified by the acid-catalyzed reaction under practically applicable conditions. By contrast, in γ-lactonization or δ-lactonization used in the method for pattern formation according to the present invention, not less than 30% of the carboxylic acid is esterified in the exposed areas. Preferably, at least 50% is esterified and, even more preferably, at least 70% is esterified. This results in significantly changed dissolution rate in the exposed areas and, in addition, no cross-linking reaction occurs. As a result, the prior art problem of swelling can be avoided, and a fine pattern can be formed.

These and other objects, features and advantages of the present invention will be readily apparent in view of the following detailed description of the preferred embodiments in conjunction with the drawings.

DETAILED DESCRIPTION OF THE PREFERRED EMBODIMENTS

Figure 1:
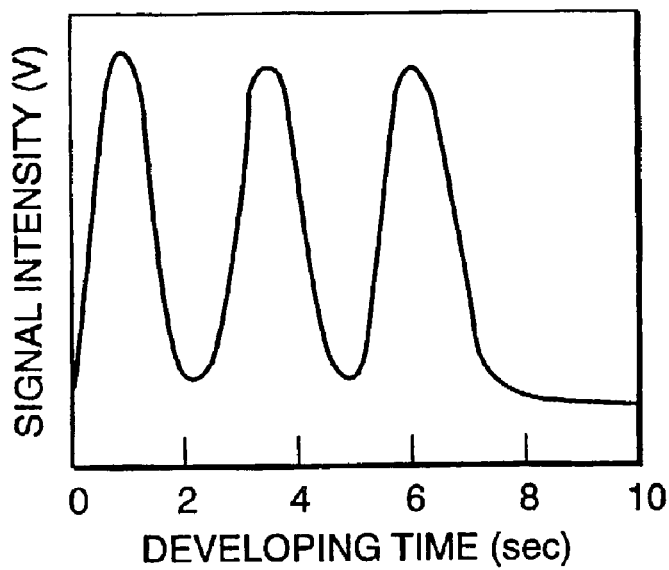
FIG. 1 is a graph showing the relationship between the developing time and the intensity of monitoring light measured by means of a dissolution rate monitor in the case where the polymer coating of Synthesis Example 1 was immersed in an aqueous alkali developing solution.

The present invention will be described in more detail with reference to the following Examples, although the present invention is by no means limited to these Examples only. Before describing the Examples, Synthesis Examples for materials used in the present invention will be described.

SYNTHESIS EXAMPLE 1

This synthesis example is directed to the synthesis of polymer (1b) (illustrated below as chemical formulas 14 or 15), a γ-hydroxy carboxylic acid structure. 21.2 g of 5-ethylenebicyclo[2.2.1]hept-2-ene, 19.6 g of maleic anhydride, 2.56 g of 2,2'-azobisisobutyronitrile, and 240 g of tetrahydrofuran were placed in a 500-ml, three-necked flask equipped with a thermometer, a condenser pipe, and a nitrogen inlet pipe, and the mixture was heated under reflux at 70C while introducing nitrogen for 8 hr to conduct polymerization. After the completion of the polymerization, the reaction mixture was poured into 1000 ml of n-hexane to precipitate the resultant polymer, which was then dried to give 37.5 g of a 5-methylenebicyclo[2.2.1]hept-2-ene/ maleic anhydride copolymer (1a) (yield 92%). The polymer was analyzed by various methods and was found to mainly have a structure represented by the following formula:

[Chemical Formula 13]

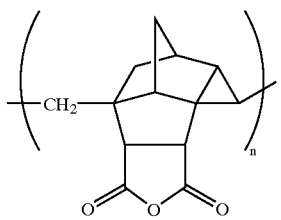

(1a)

where n is an integer.

The molecular weight of the polymer in terms of polystyrene was determined in tetrahydrofuran by gel-permeation chromatography (GPC). As a result, it was found that the weight average molecular weight and the number average molecular weight of the polymer were 5,800 and 2,500, respectively.

1.9 g of sodium borohydride and 30 g of tetrahydrofuran were placed in a 500-ml, three-necked flask and cooled to 0C under nitrogen, and a solution of 10 g of 5-methylenebicyclo[2.2.1]hept-2-ene/maleic anhydride copolymer synthesized above in 100 g of tetrahydrofuran was added dropwise to the flask with stirring for about 1 hr. After the addition of the solution was completed, the mixture was stirred for several hours and then allowed to stand overnight.

The solution was poured into about 300 ml of water, and about 1 N aqueous hydrochloric acid solution was then gradually added thereto to render the solution weakly acidic. About 150 ml of ethyl acetate was added to the solution to effect extraction twice, and the resultant organic layer was washed twice with 100 ml of water. The washed organic layer was dried over anhydrous sodium sulfate, and the solvent was removed by distillation under reduced pressure to concentrate the organic layer. The concentrate was then poured into 500 ml of n-hexane, and the precipitated polymer was dried to give 7.8 g of a polymer as white powder. The polymer was analyzed by various methods and found to be a polymer (1b) having at least a structure formed by lactonization as a result of the reduction of the anhydride portion of (1a) and the γ-hydroxy carboxylic acid structure formed as a result of the ring opening of the lactone. Polymer (1b) is represented by the following chemical formulas 14 and 15:

[Chemical Formula 14]

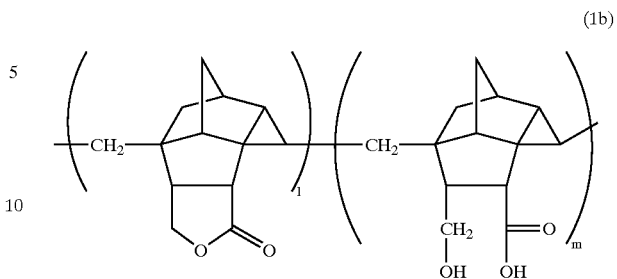

(1b)

or

[Chemical Formula 15]

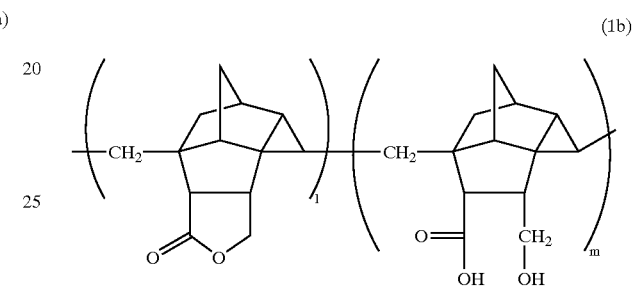

(1b)

where 1 and m are integers.

Figure 2:
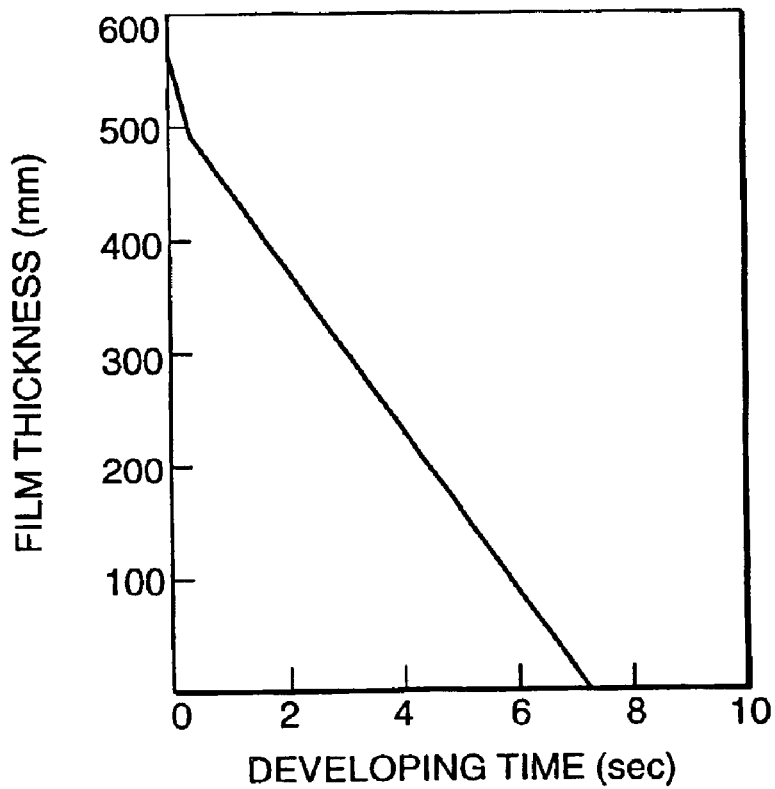
FIG. 2 is a graph showing the relationship between the dissolution time and the film thickness in the case where the polymer coating of Synthesis Example 1 was immersed in an aqueous alkali developing solution.

100 parts by weight of the polymer (1b) was dissolved in 600 parts by weight of cyclohexanone, and the solution was filtered through a filter having a pore diameter of 0.2 μm. The filtrate was then spin-coated on a silicon substrate, and the coating was baked at 100C for 2 min, thereby forming a polymer film. The film (thickness 570 nm) formed on the silicon substrate was immersed in an aqueous tetramethylammonium hydroxide solution (concentration 0.113 wt %). As a result, the film was dissolved in the solution in 7.2 sec with the interference color being changed, and finally no film remained undissolved. The dissolution was examined by means of a dissolution rate monitor. As a result, it was found that the film was dissolved without swelling. The relationship between the development time and the intensity of monitoring light as raw data obtained by the dissolution rate monitor is shown in FIG. 1. The relationship between the dissolution time and the film thickness obtained by analyzing the data shown in FIG. 1 is shown in FIG. 2.

The absorption spectrum of the film applied on a lithium fluoride substrate was measured with a vacuum ultraviolet spectrometer (manufactured by ARC). As a result, it was found that the absorbance at 193 nm was as small as 0.80 in the case of a film thickness of 1.0 μm.

SYNTHESIS EXAMPLE 2

This example is directed to the synthesis of polymer (2b) having a γ-hydroxy carboxylic acid structure. Free-radical polymerization was carried out in the same manner as in Synthesis Example 1, except that 21.6 g of cycloocta-1,5-diene was used instead of 21.2 g of the 5-methylenebicyclo [2.2.1]hept-2-ene. Thus, 38 g of a cycloocta-1,5-diene/ maleic anhydride copolymer (2a) was prepared (yield 93%). The polymer was analyzed by various methods and was found to mainly have a structure represented by the following formula:

[Chemical Formula 16]

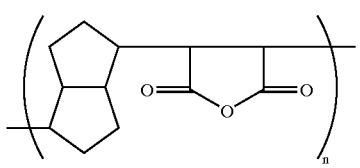
(2a)

where n is an integer.

The molecular weight of the polymer in terms of polystyrene was measured. As a result, it was found that the weight average molecular weight and the number average molecular weight were 1,400 and 1,000, respectively.

In the same manner as in Synthesis Example 1, the portion of the anhydride was reduced with sodium borohydride and hydrolyzed. The polymer was analyzed by various methods and found to be a polymer (2b) having at least the structure formed by lactonization as a result of the reduction of the anhydride portion of (2a) and the γ-hydroxy carboxylic acid structure formed as a result of ring opening of the lactone. Polymer (2b) is represented by the following formulas:

[Chemical Formula 17]

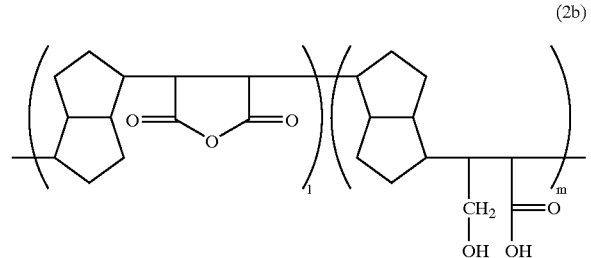
(2b)

or

[Chemical Formula 18]

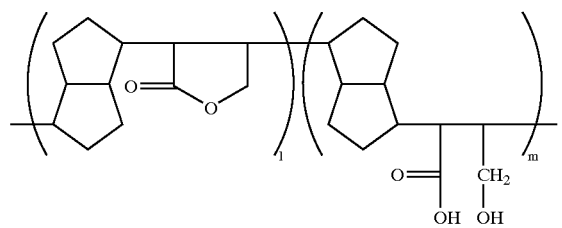
(2b)

where l and m are integers.

SYNTHESIS EXAMPLE 3

This example is directed to the synthesis of polymer (3b) having a γ-hydroxy carboxylic acid structure. Free-radical polymerization was carried out in the same manner as in Synthesis Example 1, except that 24 g of 5-ethylenebicyclo[2.2.1]hept-2-ene was used instead of 21.2 g of the 5-methylenebicyclo[2.2.1]hept-2-ene. Thus, 37 g of a 5-ethylenebicyclo[2.2.1]hept-2-ene/maleic anhydride copolymer (3a) was prepared (yield 86%). The polymer was analyzed by various methods and was found to mainly have a structure represented by the following formula:

[Chemical Formula 19]

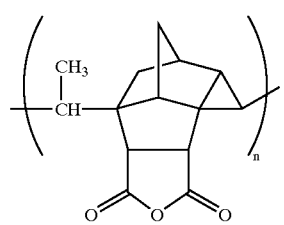
(3a)

where n is an integer.

The molecular weight of the polymer in terms of polystyrene was measured. As a result, it was found that the weight average molecular weight and the number average molecular weight were 3,300 and 2,000, respectively.

In the same manner as in Synthesis Example 1, the portion of the anhydride was reduced with sodium borohydride and hydrolyzed. The polymer was analyzed by various methods and found to be a polymer (3b) having at least the structure formed by lactonization as a result of the reduction of the anhydride portion of (3a) and the γ-hydroxy carboxylic acid structure formed as a result of ring opening of the lactone. Polymer (3b) is represented by the following formulas:

[Chemical Formula 20]

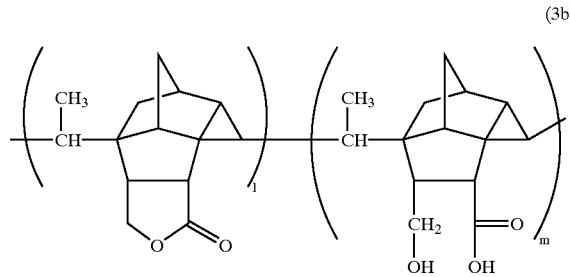
(3b)

or

[Chemical Formula 21]

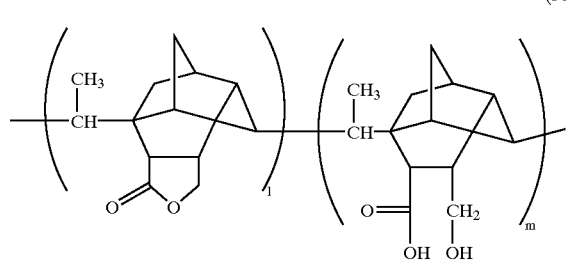
(3b)

where l and m are integers.

SYNTHESIS EXAMPLE 4

This example is directed to the synthesis of polymer (4b) having a γ-hydroxy carboxylic acid structure. Free-radical polymerization was carried out in the same manner as in Synthesis Example 1, except that 24 g of 5-vinylbicyclo[2.2.1]hept-2-ene was used instead of 21.2 g of the 5-methylenebicyclo[2.2.1]hept-2-ene. Thus, 26 g of a 5-vinylbicyclo[2.2.1]hept-2-ene/maleic anhydride copolymer (4a) was prepared (yield 59%). The polymer was analyzed by various methods and was found to mainly have a structure represented by the following formula:

[Chemical Formula 22]

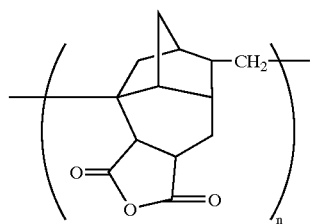

(4a)

where n is an integer.

The molecular weight of the polymer in terms of polystyrene was measured. As a result, it was found that the weight average molecular weight and the number average molecular weight were 2,900 and 1,700, respectively.

In the same manner as in Synthesis Example 1, the portion of the anhydride was reduced with sodium borohydride and hydrolyzed. The polymer was analyzed by various methods and found to be a polymer (4b) having at least the structure formed by lactonization as a result of the reduction of the anhydride portion of (4a) and the γ-hydroxy carboxylic acid structure formed as a result of ring opening of the lactone. Polymer (3b) has a structure represented by the following formulas:

[Chemical Formula 23]

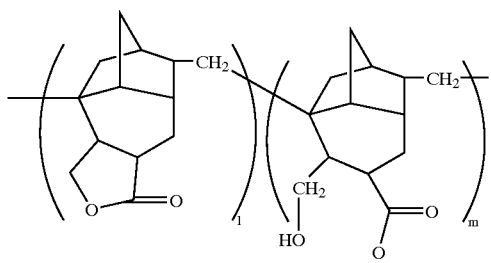

(4b)

[Chemical Formula 24]

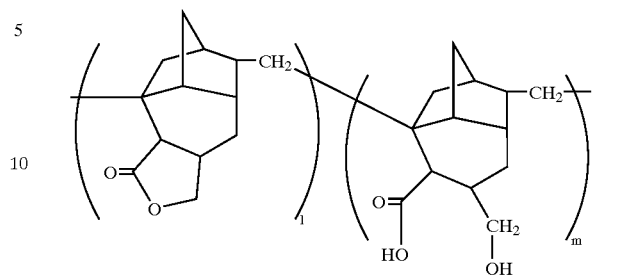

(4b)

or where 1 and m are integers.

SYNTHESIS EXAMPLE 5

(5-1). This example is directed to the synthesis of lithocholic acid dimer (5a). 11.3 g (0.030 mol) of lithocholic acid, 2.4 g (0.030 mol) of pyridine, and 100 ml of tetrahydrofuran were placed in a 300-ml, three-necked flask under a nitrogen stream, and a solution of 2.3 g (0.015 mol) of succinyl chloride in 30 ml of tetrahydrofuran was added dropwise thereto while cooling at 0C. After the completion of the dropwise addition, the mixture was stirred at room temperature for 2 hours and then refluxed for 2 hours. After the reflux, the precipitated black salt was filtered off, and the solution was added dropwise to 1000 ml of a 1% aqueous hydrochloric acid solution. The resultant gray precipitate was suction filtered, washed with water, and dried to give 12.6 g of a lithocholic acid dimer (5a) represented by the following formula.

[Chemical Formula 25]

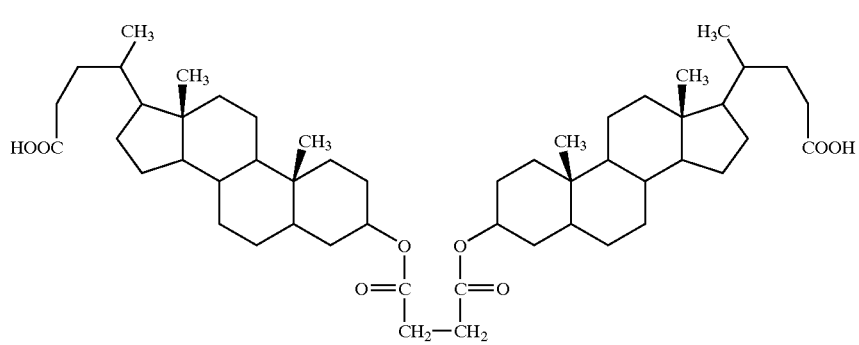

(5a)

In this example, lithocholic acid was used as the alicyclic compound having a carboxylic acid structure. In addition to this compound, deoxycholic acid, cholic acid, ursodeoxycholic acid and the like may be used. Since, however, these compounds have a plurality of alcoholic hydroxyl groups within the molecule, the reaction thereof with the dicarboxylic acid chloride does not provide a dimer but an oligomer. Also for the dicarboxylic acid chloride, besides succinyl chloride, any dicarboxylic acid chloride may be used such as malonyl dichloride or 1,3-adamantanedicarboxylic acid chloride. (5-2). This example is directed to the synthesis of 1-(tetrahydropyranyloxy)-2-bromoethane (5b) and 1-(tetrahydropyranyloxy)-3-bromopropane (5c). 12.5 g (0.10 mol) of 2-bromoethanol and 12.6 g (0.15 mol) of 3,4-dihydro-2H-pyrane were dissolved in 200 ml of ethyl acetate, and 1.0 g of pyridinium p-toluenesulfonate was added thereto. Then the mixture was stirred at room temperature for 4 hours. After the infrared absorption spectrum showed that the alcoholic hydroxyl group disappeared, 80 ml of a 2.38% aqueous tetramethylammonium hydroxide solution was added to the solution, and washing was conducted twice, followed by washing with 80 ml of water twice. The organic layer was dried over sodium sulfate and distilled under reduced pressure to give 15.7 g of 1-(tetrahydropyranyloxy)-2-bromoethane (5b) represented by the following formula.

[Chemical Formula 26]

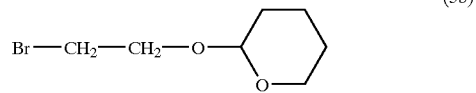

(5b)

1-(Tetrahydropyranyloxy)-3-bromopropane (5c) was synthesized in the same manner as described above and is represented by the following formula.

[Chemical Formula 27]

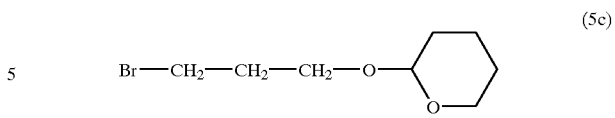

(5c)

(5-3). This example is directed to the synthesis of compound (5d) having γ-hydroxy carboxylic acid structure and compound (5e) having δ-hydroxy carboxylic acid structure. 100 ml of dry tetrahydrofuran was added to 30 ml (0.060 mol) of a 2.0 M lithium diisopropylamide solution (a commercially available product) under a dry nitrogen stream. A solution of 11.7 g (0.014 mol) of the lithocholic acid dimer (5a) synthesized above in dry tetrahydrofuran was added dropwise thereto so that the reaction temperature did not exceed 0C, followed by stirring at 0C. 5.4 g (0.030 mol) of hexamethylphosphoric triamide was added to the solution and the mixture was stirred at 0C. Then 15.7 g of 1-(tetrahydropyranyloxy)-2-bromoethane (5b) synthesized above was quickly added thereto at 0C. Although a rise in temperature occurred, the mixture was stirred as it was and allowed to stand at room temperature for 2 hours. After 200 to 300 ml of an ice-cooled 5% aqueous hydrochloric acid solution was added thereto to render the mixture weakly acidic, extraction was carried out twice with 150 ml of diethyl ether. Thereafter, the organic layer was washed with 100 ml of a 3% aqueous hydrochloric acid solution, further washed twice with 100 ml of water, and dried over sodium sulfate. After the drying, the solvent was removed by distillation under reduced pressure, and the resultant concentrate was reprecipiated from hexane to give 12.1 g of a compound (5d) having a γ-hydroxy carboxylic acid structure. The product was analyzed by various methods. As a result, it was found that the product had a structure with a part of the tetrahydropyranyl group remaining unchanged and represented by the following formula:

[Chemical Formula 28]

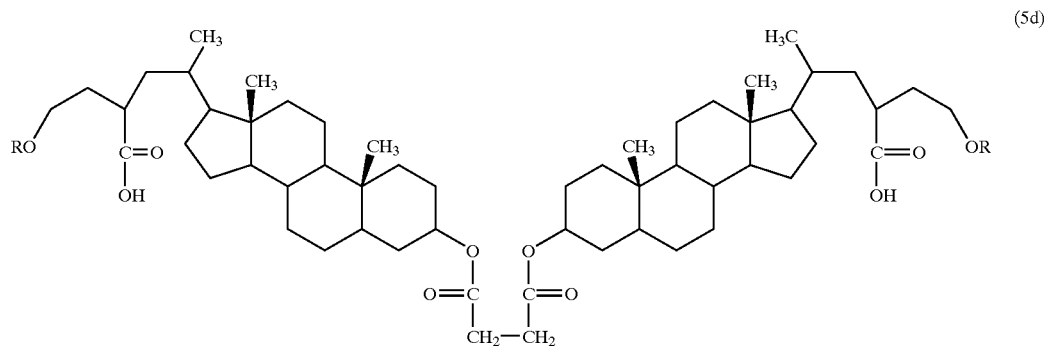

(5d)

where R represents a hydrogen atom or a tetrahydropyranyl group.

A compound (5e) having a δ-hydroxy carboxylic acid structure was prepared in the same manner as described above, except that, instead of the 1-(tatrahydropyranyloxy)-2-bromoethane (5b), an equimolar amount of 1-(tetrahydropyranyloxy)-3-bromopropane (5c) was used. The product was analyzed by various methods. As a result, it was found that the product had a structure with a part of the tetrahydropyranyl group remaining unchanged and represented by the following formula:

[Chemical Formula 29]

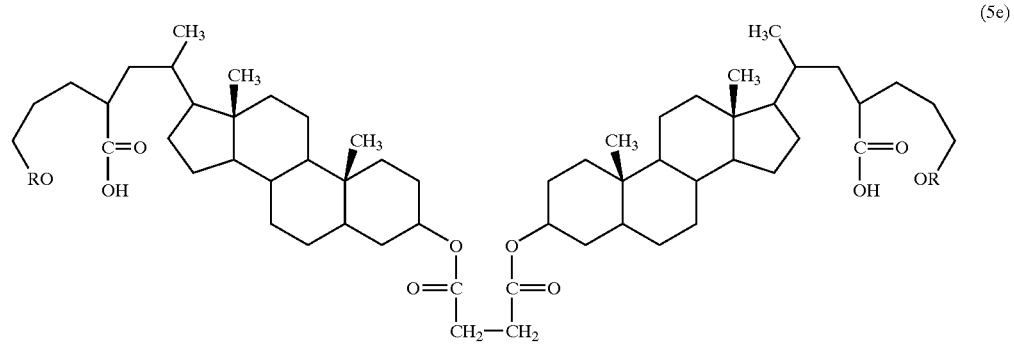

(5e)

where R represents a hydrogen atom or a tetrahydropyranyl group.

EXAMPLE 1

100 parts by weight of the polymer (1b) having a γ-hydroxy carboxylic acid structure synthesized in Synthesis Example 1 and 2 parts by weight of an acid generator, triphenylsulfonium triflate, were dissolved in 600 parts by weight of cyclohexanone, and the solution was filtered through a Teflon filter having a pore diameter of 0.20 μm to prepare a resist solution. The resist solution was applied by spin-coating onto a silicon substrate which had been treated with hexamethyldisilazane, and the coating was heat-treated at 100C for 2 min, thereby forming a 0.54 μm-thick resist film. The absorption spectrum of this film was measured with an ultraviolet-visible spectrophotometer. As a result, it was found that the transmittance at 193 nm was 25%.

The substrate coated with the above resist was placed in an apparatus for an exposure experiment, wherein the interior of the apparatus had been purged with nitrogen, and a Levenson type phase-shifting mask formed on a quartz plate was brought into intimate contact with the coated substrate. An ArF excimer laser was applied through the mask, followed by post-baking at 100C for 2 min. The resist film was immersed in an aqueous tetramethylammonium hydroxide solution (concentration 0.113 wt %) at 23C. As a result, the film in its unexposed areas was dissolved in the solution in 30 sec. In consideration of this dissolution time, the development was carried out for 120 sec, that is, a period of time which was 4 times longer than the dissolution time, followed by rinsing with pure water for 60 sec. As a result, an exposure of 20 mJ/cm$^2$ provided a negative 0.20 μm line-and-space pattern. In this case, no swelling of the pattern was observed.

The substrate with the pattern provided thereon was immersed in tetrahydrofuran. As a result, the pattern was instantaneously dissolved, indicating that no cross-linking occurred. Furthermore, the resist film was exposed through a Levenson type phase-shifting mask by means of a KrF excimer laser stepper (NA=0.45). After the exposure under the above process conditions, baking and development were carried out. As a result, an exposure of 30 mJ/cm$^2$ provided a negative 0.18 μm line-and-space pattern. In this case, no swelling of the pattern was observed.

For the resist film (thickness 540 nm) applied on an aluminum substrate, etching was carried out by means of a dry etching apparatus of an ECR system under the following conditions:

| | |
|---|---|
| Cl2 flow rate: | 90 sccm |
| BCl$_3$ flow rate: | 60 sccm |
| gas pressure: | 1.3 Pa |
| RF bias power: | 140 W |

As a result, the etching rate of the resist was found to be 1230 nm/min, which was lower than the etching rate of polymethyl methacrylate, 1580 nm/min, as compared under the same conditions.

The resist applied on an NaCl plate was irradiated with an ArF excimer laser at 20 mJ/cm$^2$ in the same manner as described above. In this case, before the exposure and after the exposure and baking, the infrared absorption spectra were measured by means of FT-1720X manufactured by Parkin-Elmer Corp. As a result, it was found that the peak at 3300 cm$^{-1}$ assignable to the carboxylic acid and the hydroxyl group after the exposure and baking was significantly reduced as compared with the peak before the exposure. Further, it was found that the peak at 1705 cm$^{-1}$ assignable to the carboxylic acid was reduced, while the peak at 1770 cm$^{-1}$ assignable to the lactone was increased. From the intensities of the above absorptions, it was found that about 72% of the carboxylic acid before the exposure was lactonized after the exposure.

The resist film initially had a polymer structure (1b) having a γ-hydroxy carboxylic acid structure and, due to the carboxylic acid structure, was soluble in an alkali. Exposure to the ArF excimer resulted in the generation of trifluoromethanesulfonic acid from the acid generator, triphenylsulfonium triflate. During baking after the exposure, the γ-hydroxy carboxylic acid structure in the polymer was subjected to intramolecular dehydration catalyzed by the acid and esterified to cause γ-lactonization. This rendered the exposed areas insoluble in the alkali developing solution, and a negative pattern was formed. In this case, the negative pattern was formed not by a cross-linking reaction but due to a marked reduction in the amount of the carboxylic acid derived from the lactonization. By virtue of this, swelling could be avoided and a fine pattern could be formed.

EXAMPLE 2

Instead of the polymer (1b) having a γ-hydroxy carboxylic acid structure used in Example 1, 100 parts by weight of the polymer (2b) synthesized in Synthesis Example 2, 30 parts by weight of the compound (5d) having a γ-hydroxy carboxylic acid structure synthesized in Synthesis Example 5, and 2 parts by weight of an acid generator, trifluoromethanesulfonyloxynaphthalimide, were dissolved in 600 parts by weight of cyclohexanone, and the solution was filtered through a Teflon filter having a pore diameter of 0.20 μm to prepare a resist solution. The resist solution was applied by spin-coating onto a silicon substrate which had been treated with hexamethyldisilazane in the same manner as in Example 1, and the coating was heat-treated at 90C for 2 min, thereby forming a 0.52 μm-thick resist film. The absorption spectrum of this film was measured with an ultraviolet-visible spectrophotometer. As a result, it was found that the transmittance at 193 nm was 60%.

In the same manner as in Example 1, the substrate coated with the above resist was irradiated with an ArF excimer laser through a phase-shifting mask, followed by post-baking at 90C for 2 min. The resist film was immersed in an aqueous tetrabutylammonium hydroxide solution (concentration 0.40 wt %) at 23C. As a result, the film in its unexposed areas was dissolved in the solution in 15 sec. In consideration of this dissolution time, the development was carried out for 60 sec, that is, a period of time which was 4 times longer than the dissolution time, followed by rinsing with pure water for 60 sec. As a result, an exposure of 27 mJ/cm$^2$ provided a negative 0.22 μm line-and-space pattern. In this case, no swelling of the pattern was observed.

For the resist film (thickness 520 nm) applied on an aluminum substrate, etching was carried out by means of a dry etching apparatus of an ECR system under the same conditions as in Example 1. As a result, the etching rate of the resist was found to be 1090 nm/min, which was substantially the same as the etching rate of polyhydroxystyrene, 1080 nm/min, as compared under the same conditions.

EXAMPLE 3

100 parts by weight of the polymer (1b) having a γ-hydroxy carboxylic acid structure used in Example 1, 30 parts by weight of the compound (5e) having a δ-hydroxy carboxylic acid structure synthesized in Synthesis Example 5, and 3 parts by weight of an acid generator, dimethylphenylsulfonium triflate, were dissolved in 600 parts by weight of cyclohexanone, and the solution was filtered through a Teflon filter having a pore diameter of 0.20 μm to prepare a resist solution.

The resist solution was applied by spin-coating onto a silicon substrate which had been treated with hexamethyldisilazane in the same manner as in Example 1, and the coating was heat-treated at 90øC. for 2 min, thereby forming at 0.54 Am-thick resist film. The absorption spectrum of this film was measured with an ultraviolet-visible spectrophotometer. As a result, it was found that the transmittance at 193 nm was 65%.

In the same manner as in Example 1, the substrate coated with the above resist was irradiated with an ArF excimer laser through a phase-shifting mask, followed by post-baking at 90C for 2 min. The resist film was immersed in an aqueous tetramethylammonium hydroxide solution (concentration 0.113 wt %) at 23C. As a result, the film in its unexposed areas was dissolved in the solution in 12 sec. In consideration of this dissolution time, the development was carried out for 48 sec, that is, a period of time which was 4 times longer than the dissolution time, followed by rinsing with pure water for 60 sec. As a result, an exposure of 35 mJ/cm2 provided a negative 0.22 μm line-and-space pattern. In this case, no swelling of the pattern was observed.

For the resist film (thickness 540 nm) applied on an aluminum substrate, etching was carried out by means of a dry etching apparatus of an ECR system under the same conditions as used in Example 1. As a result, the etching rate of the resist was found to be 1075 nm/min, which was substantially the same as the etching rate of polyhydroxystyrene, 1080 nm/min, as compared under the same conditions.

EXAMPLE 4

Instead of the polymer (1b) having a γ-hydroxy carboxylic acid structure used in Example 1, 100 parts by weight of the polymer (3b) having a γ-hydroxy carboxylic acid structure synthesized in Synthesis Example 3 and 3 parts by weight of an acid generator, diphenyliodonium triflate, were dissolved in 600 parts by weight of cyclohexanone, and the solution was filtered through a Teflon filter having a pore diameter of 0.20 μm to prepare a resist solution. The resist solution was applied by spin-coating onto a silicon substrate which had been treated with hexamethyldisilazane in the same manner as in Example 1, and the coating was heat-treated at 90C for 2 min, thereby forming a 0.55 μm-thick resist film.

This resist film was exposed in a line-and-space pattern using an electron beam exposure system at an acceleration voltage of 50 kV. The exposed film was baked at 90C for 2 min and then immersed in an aqueous tetramethylammonium hydroxide solution (concentration 0.113 wt %) at 23C. As a result, the film in its unexposed areas was dissolved in the solution in 20 sec. In consideration of this dissolution time, the development was carried out for 80 sec, that is, a period of time which was 4 times longer than the dissolution time, followed by rinsing with pure water for 60 sec. As a result, an exposure of 15° C./cm2 provided a negative 0.20 μm line-and-space pattern. In this case, no swelling of the pattern was observed.

EXAMPLE 5

Instead of the polymer (1b) having a γ-hydroxy carboxylic acid structure used in Example 1, 100 parts by weight of the polymer (4b) having a γ-hydroxy carboxylic acid structure synthesized in synthesized Example 4 and 5 parts by weight of an acid generator, camphorsulfonyloxynaphthalimide, were dissolved in 600 parts by weight of cyclohexanone, and the solution was filtered through a Teflon filter having a pore diameter of 0.20 μm to prepare a resist solution. The resist solution was applied by spin-coating onto a silicon substrate which had been treated with hexamethyldisilazane in the same manner as in Example 1, and the coating was heat-treated at 90C for 2 min, thereby forming a 0.52 μm-thick resist film.

Further, the resist film was exposed through a Levenson type phase-shifting mask by means of a KrF excimer laser stepper (NA=0.45). After the exposure, the exposed film was baked at 90C for 2 min and then immersed in an aqueous tetramethylammonium hydroxide solution (concentration 0.113 wt %) at 23C. As a result, the film in its unexposed areas was dissolved in the solution in 25 sec. In consideration of this dissolution time, the development was carried out for 100 sec, that is, a period of time which was 4 times longer than the dissolution time, followed by rinsing with pure water for 60 sec. As a result, an exposure of 20 mJ/cm provided a negative 0.18 μm line-and-space pattern. In this case, no swelling of the pattern was observed.

EXAMPLE 6

Figure 3:
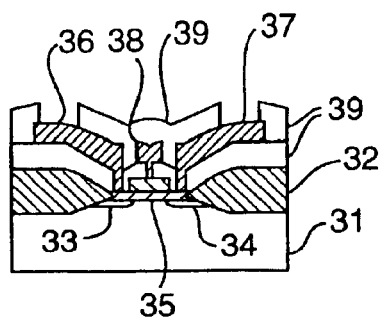
FIG. 3 is a cross-sectional view of a MOS (metal-oxide semiconductor) transistor.

FIG. 3 is a cross-sectional view of a conventional MOS (metal oxide semiconductor) transistor. The construction of this transistor is such that a drain current which flows across a source electrode 36 and a drain electrode 37 is regulated by the voltage applied to a gate electrode 38.

The process for preparing such a MOS transistor can be explained in roughly ten steps which may be roughly divided into three groups: steps up to the formation of a field oxide film, steps up to the formation of a gate, and a final step. The steps up to the formation of a field oxide film (FIGS. 4(a)–4(h)) include the step of forming a resist pattern on a silicon nitride film. The field oxide film was formed according to an embodiment described below.

Figure 4A:
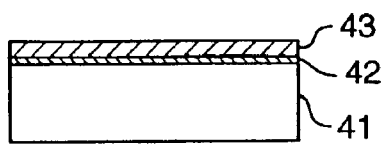
FIGS. 4(a)–4(h) illustrate various stages involved in the formation of a field oxide film and a silicon gate according to the method for pattern formation of the present invention.
Figure 4B:
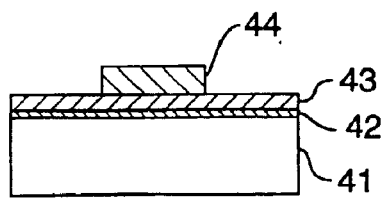
Figure 4C:
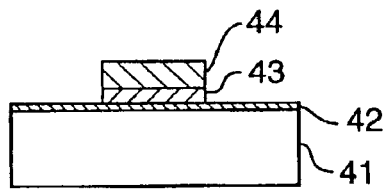
Figure 4D:
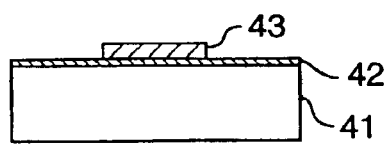
Figure 4E:
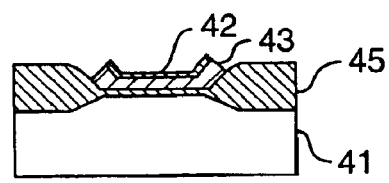
Figure 4F:
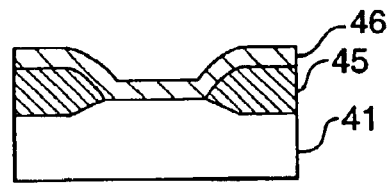
Figure 4G:
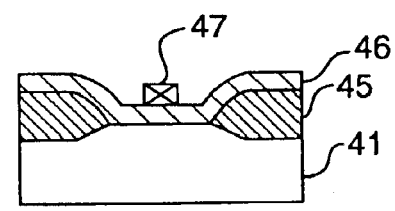
Figure 4H:
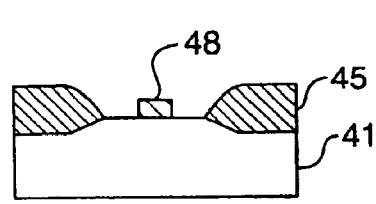

As shown in FIG. 4(a), a 50 nm-thick oxide film 42 was formed on a p-type silicon wafer 41 by a conventional method, and a 200 nm-thick silicon nitride film was formed thereon by plasma CVD to prepare a substrate. A 0.50 μm-line resist pattern 44 was formed using the materials and method described in Example 1 (FIG. 4(b)). After the silicon nitride film was etched using this resist pattern as a mask (FIG. 4(c)), boron ion implantation was conducted for a channel stopper by using again this resist as a mask. The resist was separated and removed (FIG. 4(d)), and a 1.2 μm-thick field oxide film was formed in an element isolation region by selective oxidation using a silicon nitride film as a mask (FIG. 4(e)).

Thereafter, the step of forming a gate and the final step were carried out by a conventional method. After the silicon nitride film was etched, the gate was oxidized, and the growth of polycrystalline silicon was carried out (FIG. 4(f)). A 0.20 μm-line resist pattern was formed on the substrate by the method for pattern formation described in Example 1 (FIG. 4(g)). Polycrystalline silicon was etched using the resist pattern as a mask by a conventional method to form a gate (FIG. 4(h)). The thin oxide films in the source and the drain were etched and arsenic was diffused in the polycrystalline silicon gate, the source, and the drain. Then oxide films were formed in the polycrystalline silicon gate and the source and drain regions. A contact for aluminum wiring in the gate, the source, and the drain was formed and vapor deposition of aluminum and opening were conducted. Then a protective film was further formed, and a pad for bonding was formed. Thus, a MOS transistor as shown in FIG. 3 is formed.

Although the method for the formation of a field oxide film for MOS transistors has been particularly described above, it should be understood that the present invention is not limited to the above embodiment and can be applied to processes and steps for preparing other semiconductor devices.

COMPARATIVE EXAMPLE 1

10 g of the 5-methylenebicyclo[2.2.1]hept-2-ene/maleic anhydride copolymer synthesized in Synthesis Example 1, together with 150 ml of methanol and four drops of hydrochloric acid, was heated under reflux for about 10 hours. Although the polymer was insoluble in methanol in an early stage, the heating under reflux caused the polymer to be dissolved and become homogeneous. Thereafter, methanol was removed by distillation under reduced pressure, and the residue was redissolved in tetrahydrofuran and reprecipitated from n-hexane to give 10.6 g of a white powdery polymer (1c). The polymer was analyzed by various methods and was found to mainly have a structure containing carboxylic acid and carboxylic acid methyl ester groups and represented by the following formulas:

[Chemical Formula 30]

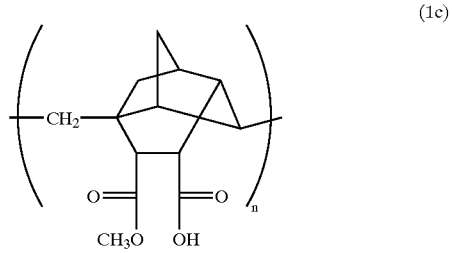

(1c)

or

[Chemical Formula 31]

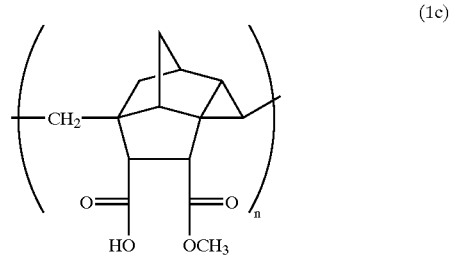

(1c)

where n is an integer.

100 parts by weight of the polymer (1c), 30 parts by weight of 1-hydroxymethyladamantane, and 3 parts by weight of an acid generator, triphenylsulfonium triflate, were dissolved in 600 parts by weight of cyclohexanone, and the solution was filtered through a Teflon filter having a pore diameter of 0.20 μm to prepare a resist solution.

The resist solution was applied by spin-coating onto a silicon substrate which had been treated with hexamethyldisilazane, and the coating was heat-treated at 100C for 2 min, thereby forming a 0.51 μm-thick resist film.

In the same manner as in Example 1, the substrate coated with the above resist was irradiated with an ArF excimer laser, baked at 100C for 2 min, and then developed with an aqueous tetramethylammonium hydroxide solution (0.113 wt %). Even exposure to the ArF excimer laser at 300 mJ/cm² could not provide any pattern, and the film both in its exposed and unexposed areas was dissolved in 15 sec.

The resist applied on an NaCl plate was irradiated with an ArF excimer laser at 300 mJ/cm² in the same manner as described above. In this case, before the exposure and after the exposure and baking, the infrared absorption spectra were measured in the same manner as in Example 1. As a result, it was found that a change in the spectrum after the exposure and baking was small and only about 3% of the carboxylic acid was esterified.

An experiment was carried out in the same manner as described above, except that, instead of the 1-hydroxyadamantane, the same amount of 2-adamantanol was used. Also in this case, the formation of a negative pattern failed. Infrared absorption spectrum analysis revealed that only about 3% of the carboxylic acid could be esterified.

COMPARATIVE EXAMPLE 2

100 parts by weight of the polymer (1b) having a γ-hydroxy carboxylic acid structure synthesized in Synthesis Example 1 and 3 parts by weight of triphenylsulfonium triflate, an acid former, were dissolved in 6000 parts by weight of cyclohexanone, and the solution was filtered through a Teflon filter having a pore diameter of 0.20 μm to prepare a resist solution A. Separately, a resist solution B was prepared in the same manner as described just above, except that the polymer (2b) prepared in Synthesis Example 2 was used instead of the polymer (1b). Further, the procedure of Synthesis Example 1 was repeated, except that bicyclo[2.2.1]hept-2-ene was used instead of 5-methylenebicyclo[2.2.1]hept-2-ene to synthesize a cyclo[2.2.1]hept-2-ene/maleic anhydride copolymer, which was then reduced and hydrolyzed to prepare a polymer following formula (6a).

[Chemical Formula 32]

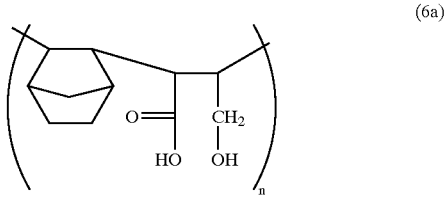

A resist solution C was prepared in the same manner as described above in connection with the preparation of the resist solution, except that the polymer (6a) was used instead of the polymer (1b).

In this case, the polymer (1b) used in the preparation of the resist solution A is a resin having repeating units of an alicyclic structure having on its side chain a γ-hydroxy carboxylic acid structure. On the other hand, the polymers (2b) and (6a) used in the preparation of the resist solutions B and C are each a resin containing directly in its backbone a γ-hydroxy carboxylic acid structure.

The surface of a silicon substrate, which has been treated with hexamethyldisilazane, was spin-coated with the resist solutions A, B, and C, and the coatings were then heat-treated at 100° C. for 2 min., thereby forming three films of the resists A, B, and C each having a thickness of 0.50 μm.

The resist-coated substrates were placed in an apparatus for an exposure experiment, wherein the interior of the apparatus has been purged with nitrogen, and an ArF excimer laser beam was applied to the resist films while stepwise varying the exposure, followed by post-baking at 100° C. for 2 min. The resist film was immersed in an aqueous tetramethylammonium hydroxide solution (concentration: 0.113 wt %) at 23° C. As a result, the films in each of their unexposed areas were dissolved in the solution in 20 to 30 sec. In consideration of this dissolution time, the development was carried out for 120 sec., that is, a period of time which was 4 times longer than the dissolution time, followed by rinsing with pure water for 60 sec.

As a result, an exposure of 15 mJ/cm$^2$ rendered resist A negative to provide a residual film thickness of substantially 100%. On the other hand, resist B had lower sensitivity and, when the post-baking after the exposure was carried out at 120° C., an exposure of 80 mJ/cm$^2$ rendered resist B negative to provide a residual film thickness of about 90%. For resist C, when the post-baking after the exposure was carried out at 120° C., even an exposure of 200 mJ/cm$^2$ could not render resist C negative. Thus, there was a difference in sensitivity among resists due to a difference in polymer structure.

The present invention can provide a method for the formation of a negative pattern which enables a fine pattern to be developed with an aqueous alkali developing solution without swelling of the pattern, utilizes esterification of a resin having a carboxylic acid structure, and can form a fine pattern with excellent resolution.

While the present invention has been described above in conjunction with the preferred embodiments, one of ordinary skill in the art would be enabled by this disclosure to make various modifications to these embodiments and still be within the scope and spirit of the present invention as defined in the appended claims.

What is claimed is:

1. A method for forming a semiconductor device comprising the steps of:

providing a substrate;

forming a coating on the substrate including a photosensitive composition which contains a γ-hydroxyl carboxylic acid structure or a δ-hydroxyl carboxylic acid structure;

irradiating the coating in a pattern to render a portion of the carboxylic acid structure, contained in the photosensitive composition, into a lactone structure by using light having a wavelength of not more than 250 nm; and forming a negative pattern of the coating by developing the coating by using an aqueous alkali developing solution, thereby leaving the portion that is irradiated.

2. A method for forming a semiconductor device according to claim 1, wherein the light is generated by an ArF excimer laser.

3. A method for forming a semiconductor device comprising the steps of:

providing a substrate having a first film;

forming a coating on the substrate including a photosensitive composition which contains a γ-hydroxyl carboxylic acid structure or a δ-hydroxyl carboxylic acid structure;

irradiating the coating in a pattern to render a portion of the carboxylic acid structure, contained in the photosensitive composition, into a lactone structure by using light having a wavelength of not more than 250 nm;

forming a negative pattern of the coating by developing the coating by using an aqueous alkali developing solution; and etching the first film by using the coating as an etching mask.

4. A method for forming a semiconductor device according to claim 3, wherein the light is generated by an ArF excimer laser.

5. A method for forming a semiconductor device according to claim 3, wherein the first film includes metal.

* * * * *